United States Patent
Watanabe et al.

(10) Patent No.: US 6,325,516 B1
(45) Date of Patent: Dec. 4, 2001

(54) EXPOSURE APPARATUS AND FIELD STOP THEREOF

(76) Inventors: Tomoyuki Watanabe; Masamitsu Yanagihara; Hideji Goto; Noritsugu Hanazaki, all of c/o Nikon Corporation, 2-3, Marunouchi 3-chome, Chiyoda-ku, Tokyo (JP)

( * ) Notice: Subject to any disclaimer, the term of this patent is extended or adjusted under 35 U.S.C. 154(b) by 0 days.

(21) Appl. No.: 09/706,775

(22) Filed: Nov. 7, 2000

Related U.S. Application Data (60) Division of application No. 09/293,953, filed on Apr. 19, 1999, now Pat. No. 6,213,607, which is a continuation of application No. 08/919,351, filed on Aug. 28, 1997, now abandoned, which is a continuation of application No. 08/391,588, filed on Feb. 21, 1995, now abandoned, which is a continuation-in-part of application No. 08/195,192, filed on Feb. 14, 1994, now Pat. No. 5,486,896.

(30) Foreign Application Priority Data

Feb. 22, 1994 (JP) .................................................. 6-022918

(51) Int. Cl.[7] .................................................. G02B 27/00
(52) U.S. Cl. ........................ 359/601; 359/608; 359/227
(58) Field of Search .................................... 359/601, 608, 359/604, 614, 227, 231, 236, 739, 740; 355/53, 71, 67, 74, 55, 35; 356/401, 363

(56) References Cited

U.S. PATENT DOCUMENTS

| | | | | |
|---|---|---|---|---|
| 4,371,258 | * | 2/1983 | Mast ....................................... | 359/889 |
| 4,741,622 | * | 5/1988 | Suwa et al. ........................... | 356/401 |
| 4,748,478 | * | 5/1988 | Suwa et al. ............................ | 355/53 |
| 5,184,196 | * | 2/1993 | Nakagawa et al. ................... | 356/401 |
| 5,194,893 | * | 3/1993 | Nishi ....................................... | 355/53 |
| 5,329,336 | * | 7/1994 | Hirano et al. ........................... | 355/53 |
| 5,335,044 | * | 8/1994 | Shiraishi ................................ | 355/53 |
| 5,416,634 | * | 5/1995 | Ning ....................................... | 359/434 |
| 5,473,410 | * | 12/1995 | Nishi ....................................... | 355/53 |
| 5,912,727 | * | 6/1999 | Kawai ..................................... | 355/67 |

FOREIGN PATENT DOCUMENTS

| | | | | |
|---|---|---|---|---|
| 0015603 | * | 1/1985 | (JP) ....................................... | 359/885 |
| 63-49218 | | 10/1988 | (JP) . | |
| 4-196513 | * | 7/1992 | (JP) . | |
| 8404821 | * | 12/1984 | (WO) .................................... | 359/885 |

* cited by examiner

Primary Examiner—Mohammad Sikder (57) ABSTRACT

An exposure apparatus has a field stop, disposed in a position conjugate to the reticle, for regulating an illumination area on the reticle. The field stop is constructed of two aperture members including light shielding portions, rectangular first and second apertures and light reducing portions formed at sides of these apertures. The exposure apparatus also has a drive system for shifting a position of the light reducing portion. and relatively moving the two aperture members during the projection.

19 Claims, 7 Drawing Sheets

FIG. 7D

EXPOSURE APPARATUS AND FIELD STOP THEREOF

CROSS-REFERENCE TO RELATED APPLICATIONS

This application is a divisional of application Ser. No. 09/293,953 filed Apr. 19, 1999 now U.S. Pat. No. 6,213,607, which is a continuation of application Ser. No. 08/919,351 filed Aug. 28, 1997, now abandoned, which is a continuation of application Ser. No. 08/391,588 filed Feb. 21, 1995, now abandoned, which is a continuation-in-part of application Ser. No. 08/195,192 filed Feb. 14, 1994 (now U.S. Pat. No. 5,486,896 issued Jan. 23, 1996).

BACKGROUND OF THE INVENTION

1. Field of the Invention

The present invention relates generally to an exposure apparatus employed for manufacturing a semiconductor device and a liquid crystal display substrate or the like and, more particularly, to an exposure apparatus for performing, a so-called picture synthesization in which a pattern having a large areal size is formed by overlapping some portions of unit-area patterns with each other on a photosensitive substrate.

2. Related Background Art

This type of exposure apparatus has hitherto involved the use of a picture synthesizing method of eventually synthesizing a desired pattern by partitioning an exposure area into a plurality of unit areas on a photosensitive substrate and repeating an exposure in accordance with each unit area in order to cope with a scale-up (increase in areal size of the exposure area) of the photosensitive substrate as an object for exposure. When effecting this picture synthesization, a positional deviation of the pattern is caused derived from a pattern depicting error of a reticle for a pattern projection, an aberration in a projection optical system and a positioning error of a stage for positioning the photosensitive substrate. For this reason, it follows that pattern breaks appear in positions of boundaries between the respective exposure areas, which should be originally connected without any gap. For preventing this, very slight quantities of boundaries between the respective exposure areas are overlapped with each other, thus effecting the exposure. When the exposure areas are overlapped, however, an exposure quantity of this portion is doubled, resulting in variation in terms of line width of the pattern at the connected portion between the respective exposure area depending on a characteristic of a photosensitive agent. Further, when the picture synthesization takes place, a stepped portion is produced at the pattern joint lines due to a positional deviation (deviation in the direction orthogonal to the direction in which the pattern extends) between the exposure areas adjacent to each other. It may happen that the characteristic of the device is to be spoiled. Further, if a different exposure apparatus is burdened per layer (per process) with a process of overlapping the picture-synthesized single-layered patterns with each other in multi layers, an overlap error of the exposure area of each layer discontinuously changes at the pattern joint lines, depending on the aberration of the lens and a difference in terms of a positioning accuracy of each exposure apparatus. As a result, especially in an active matrix liquid crystal device, a contrast discontinuously varies at the pattern joint lines, resulting in a decline of a device quality.

A method of obviating the problems inherent in the picture synthesization described above entails a technique disclosed in Japanese Patent Publication No. 63-49218. According to this technique, light reducing or light attenuating portions for reducing a quantity of the transmitted light are provided in positions, corresponding to the pattern joint lines, of a reticle or a filter superposed on the reticle. Then, pattern images passing through the light reducing portions are overlapped with each other on the photosensitive substrate, and, thus, the exposure is effected so that an exposure quantity of the pattern overlapped portion is substantially coincident with the exposure quantity of other portions.

The following problems, however, arise, in the technique stated in the above Publication.

First, when the reticle itself is provided with a light reducing or light attenuating characteristic, the number of steps of manufacturing the reticle increases, and a burden on the reticle manufacturing steps augments as in the case of increasing the possibility in which a pattern defect is to be produced during the manufacturing process. On the other hand, when using the filter to be overlapped with the reticle, there increases such a possibility that the reticle is damaged and contaminated by attaching and detaching the filter. Thus, a problem is produced in terms of a maintenance and a management of the reticle. Further, a dedicated filter is required to be prepared per reticle, and labors needed for manufacturing, maintaining and managing the filter are not ignorable.

SUMMARY OF THE INVENTION

It is a primary object of the present invention to provide an exposure apparatus and a field stop that are capable of obtaining an ideal light reducing characteristic on an original plate without necessities for giving a light reducing characteristic to the original plate itself for transferring a pattern of a reticle or the like and for preparing light reducing members disposed differently for every original plate.

To accomplish the above object, according to one aspect of the present invention, there is provided a projection exposure apparatus for irradiating a reticle disposed in a position substantially conjugate to a field stop with a light beam from a light source through the field stop, projecting an image of the reticle illuminated with the light beam on a first exposure area on a photosensitive substrate through a projection optical system and, at the same time, projecting peripheral portions of the images on a second area adjacent to the first area on the photosensitive substrate while being overlapped with each other. In this projection exposure apparatus, the field stop is constructed of two aperture members composed of light shielding portions for shielding the light beams and first and second apertures each taking a rectangular shape. At the same time, each side of the first aperture and each side of the second aperture which corresponds to each side of the first aperture are disposed substantially in parallel. The light reducing portions are provided at an arbitrary side of the first aperture and a side in a face-to-face relationship with an arbitrary side among the sides of the second aperture in such a way that a transmissivity of the light beam becomes smaller from the centers of the first and second apertures toward the light shielding portion. The first and second apertures of each of the two aperture members are combined, thereby changing a position of the light reducing portion which corresponds to the image peripheral portion.

Further, the two aperture members are respectively relatively moved by a drive system in such directions that the sides serving as the light reducing portions are extended during an image projection.

Moreover, the light shielding portion is formed by providing a light shielding material on a transparent substrate. The light reducing portion is formed at a boundary between the aperture and the light shielding portion on the transparent substrate so that a density of the light shielding material becomes higher from the aperture toward the light shielding portion.

As described above, the field stop involves a combination of two aperture members including the light shielding portions formed by providing the light shielding material on the transparent substrate, a plurality of apertures and light reducing portions provided at arbitrary sides among the sides of these apertures so that a density of the light shielding material varies in accordance with a distance from the center of the aperture. Hence, there are eliminated problems relative to a burden on manufacturing the reticle when providing the light reducing member on the reticle itself and a damage and a contamination of the reticle when attaching and detaching a light reducing filter to and from the reticle.

Further, the above two aperture members are combined and, at the same time, individually relatively moved in such directions that the sides service as the light reducing portions are extended, thereby obtaining light reducing areas. It is therefore possible to obtain an ideal light reducing characteristic on the reticle.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Figure 1:
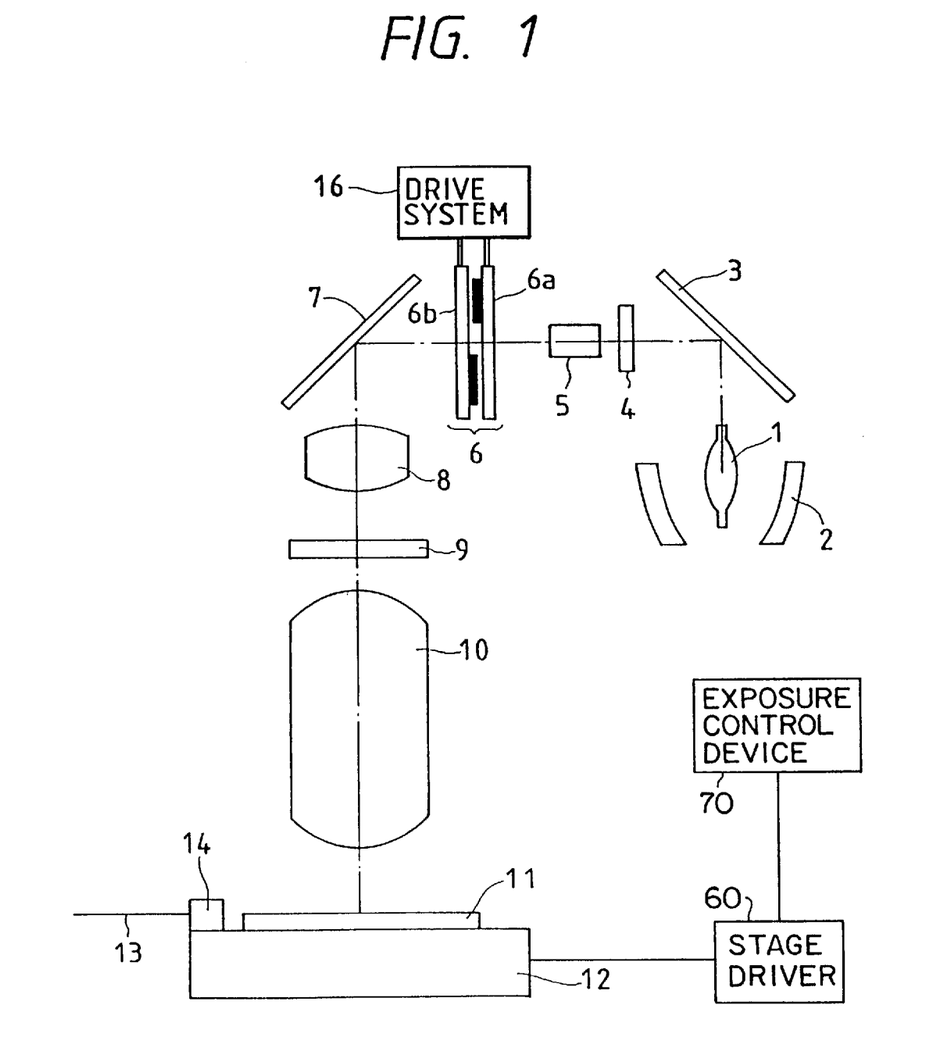
FIG. 1 is a view schematically illustrating a construction/ of an exposure apparatus in an embodiment of the present invention.

FIG. 1 schematically illustrates a construction of an exposure apparatus in accordance with an embodiment of the present invention. An ultra high pressure mercury lamp 1 serves as a light source for an exposure. Beams of illumination light emerging therefrom are converged by an elliptical mirror 2 and, after being reflected by a reflex mirror 3, are incident on a wavelength selection filter 4. The wavelength selection filter 4 admits only wavelength (generally, wavelengths of g-line and i-line) needed for the exposure. The illumination light beams penetrating the wavelength selection filter 4, when traveling through a fly eye integrator 5, turn out the light beams with a uniform distribution of illuminance and then reach a reticle blind (field stop) 6. The reticle blind 6 is moved by a drive system 16 to change a size of an aperture, thus regulating an illumination range of the illumination light. The reticle blind 6 is constructed of a light shielding portion formed such that a light shielding material such as chrome is deposited on a transparent glass substrate. The reticle blind 6 is also constructed of an aperture (light transmitting portion) deposited with no light shielding material and a light reducing portion deposited with the light shielding material at a boundary between the light shielding portion and the aperture in such a way that a density (i.e., a light transmissivity) of the light shielding material is varied. Note that a detailed description thereof will be given hereinbelow.

The light beams passing through the aperture of the reticle blind 6 are reflected by a reflex mirror 7 and fall on a lens system 8. This lens system 8 works to form an image of the aperture of the reticle blind 6 on a reticle 9, and a desired range of the reticle 9 is illuminated with the light beams. That is, the reticle 9 is conjugate to the reticle blind 6 with respect to the lens system 8. A pattern image existing in the illumination range of the reticle 9 is formed on a photosensitive substrate 11 through a projection optical system 10, whereby the pattern of the reticle 9 is exposed on a partial area of the photosensitive substrate 11. The photosensitive substrate 11 is a wafer in the process of manufacturing a semiconductor integrated circuit but a glass substrate in the process of manufacturing a liquid crystal display element.

The photosensitive substrate 11 is fixed onto a stage 12. The stage 12 is such a known stage that a pair of blocks movable in directions orthogonal to each other are superposed on each other. A position of the photosensitive substrate 11 within a horizontal plane (orthogonal to the optical axis of the projection optical system) is adjusted by this stage 12. In the case of synthesizing a picture, after finishing one exposure, the reticle 9 is replaced, and, at the same time, the stage 12 is driven to set another position of the photosensitive substrate 11 to a next exposure area. Hereinafter, the same procedures are repeated each time the exposure is finished, thus exposing all the areas of the photosensitive substrate 11. Note that the patterns for a plurality of times are formed on a single piece of or a plurality of reticles, and the pictures may be synthesized in some cases by changing the intra reticle illumination areas in combination with a change of the exposure areas of the photosensitive substrate 11.

The positional detection of the stage 12 involves emitting a laser beam 13 toward a movable mirror 14 on the stage 12 and using an unillustrated laser interferometer for measuring a distance on the basis of an interference between a reflected light beam thereof and an incident light beam.

Figure 2:
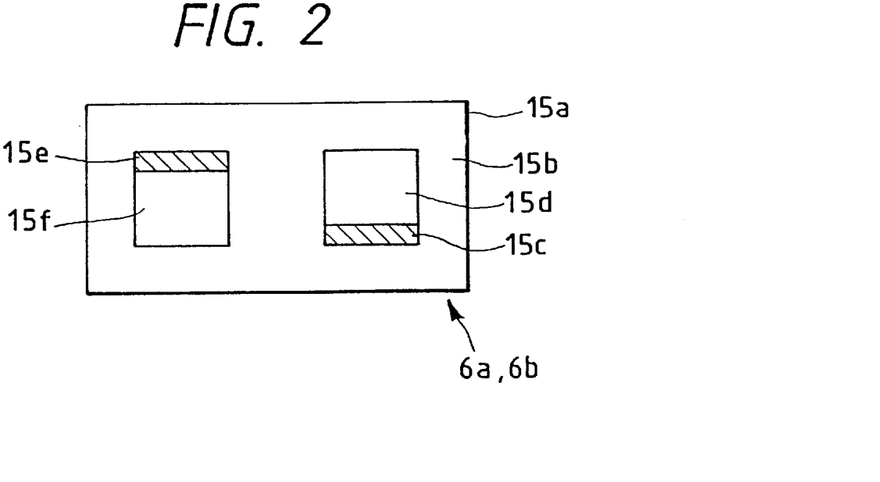
FIG. 2 is a view illustrating a configuration of a reticle blind according to the present invention.
Figure 3:
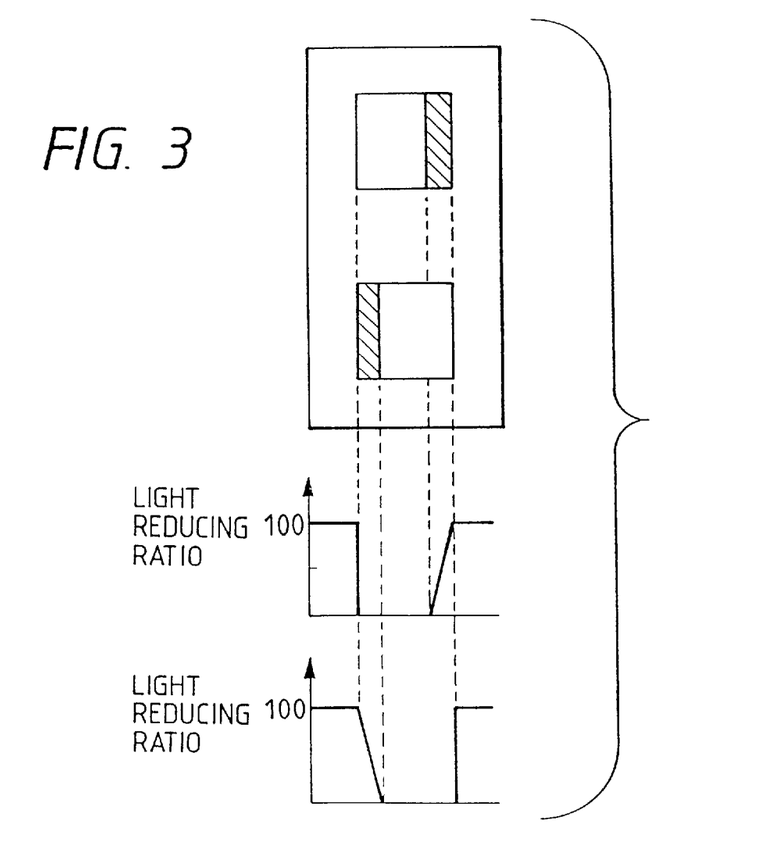
FIG. 3 is a view showing a light reducing characteristic of the reticle blind according to the present invention.

The reticle blind 6 is constructed in such a way that blinds 6a, 6b formed with two apertures as illustrated in FIG. 2 are disposed in a face-to-face relationship of the surfaces evaporation-coated with chrome (that is, the surfaces deposited with the light shielding materials being opposed to each other). Further, each of the blinds 6a, 6b includes a light shielding portion 15b and attenuating or light reducing portions 15c, 15e, formed by evaporation-coating the chrome on a transparent glass substrate 15a, for sliding the illumination light and attenuating a transmissivity of the illumination light, respectively. The blind also includes apertures 15d, 15f coated with no chrome. Further, the light reducing portion is formed by dotty chrome film evaporation deposited on the glass substrate 15a as dots each, having a size under a resolution limit of the exposure apparatus, and a density of this dotty chrome film becomes higher from the aperture 15d toward the light reducing portion 15b (alternatively from the aperture 15f toward the light shielding portion 15b), thus varying an attenuation ratio of the light reducing portion 15c (or 15e). FIG. 3 shows light reducing characteristic of one blind 6a or 6b of the reticle blind 6.

Further, it is desirable that the light reducing portion 15c formed of this dotty chrome film be so disposed that the chrome-deposited surface is deviated from a position conjugate to the reticle 9. An amount of this deviation is so determined that the photosensitive substrate is not influenced by a foreign matter adhered to the light reducing portion formed of the chrome film and having a size equal to or larger than a predetermined size. In other words, the amount of the deviation is so determined that an image of the foreign matter is not resolved.

Note that the light reducing portion is not confined to the above-mentioned but may involve the use of all materials such as a liquid crystal, EC, etc. that are capable of reducing a light quantity. Further, the light reducing characteristic of the light reducing portions 15c, 15e is not limited to an example where a quantity of the transmitted light is rectilinearly reduced in proportion to distances from the centers of the apertures 15d, 15f but may be such that the quantity of the transmitted light is curvilinearly changed on the premise that a synthesizing exposure quantity in an overlap range of the image on the photosensitive substrate is substantially coincident with an exposure quantity in other areas.

Figure 4A:
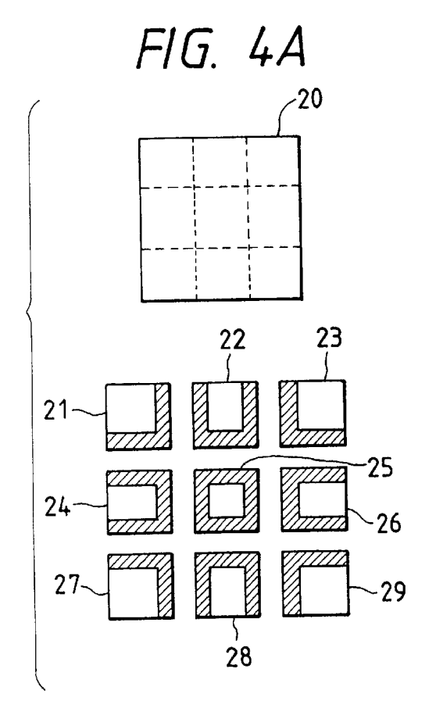
FIGS. 4A to 4D are views each showing an example of shot areas including light reducing areas that are needed for picture synthesization.

By the way, when an exposure area having a large areal size is exposed based on the picture synthesization, the way of synthesizing the picture by selecting which side to overlap among the four sides of one shot area, i.e., by setting which side of the shot area as a light reducing area may differ depending on the shot area. For this reason, there can be considered 16 ways of combinations of the sides serving as the light reducing area in each shot area in the form of the light reducing areas as indicated by oblique lines in FIGS. 4A to 4D. That is, as illustrated in FIG. 4A, when a single device 20 is formed of nine shot areas, there are required nine kinds of shot areas 21 to 29 defined by the reticle blind 6. In this connection, if one device is formed of four shot areas, there may be prepared four kinds of shot areas 21, 23, 27, 29. Also, if the single device is formed of six shot areas, there may be prepared six kinds of shot areas 21, 22, 23, 27, 28, 29 or the shot areas 21, 23, 24, 26, 27, 29.

Figure 4B:
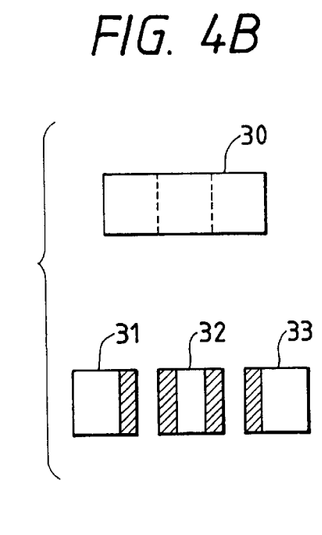
Figure 4C:
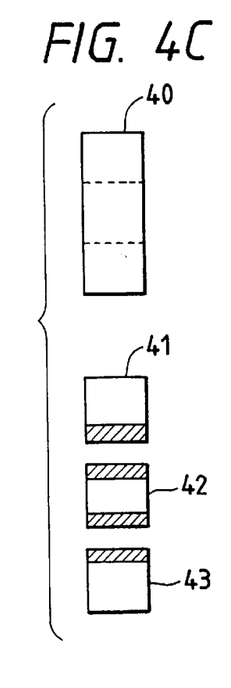
Figure 4D:
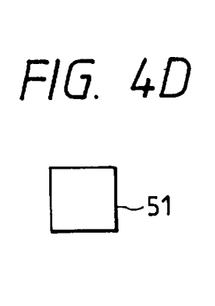

Further, as depicted in FIG. 4B, if a device 30 is formed of three shot areas arranged crosswise in one line, three kinds of shot areas 31 to 33 are required. Furthermore, as illustrated in FIG. 4C, when a device 40 is formed of three shot areas arranged vertically in one line, three shot areas 41 to 43 are needed. Note that a shot area 51 shown in FIG. 4D may be exemplified as a shot area requiring no light reducing area.

According to the present invention, the light reducing area is formed by arranging two pieces of reticle blinds as shown in FIG. 2 to as to superpose them, and, at the same time, at least one of these two reticle blinds is two-dimensionally moved by the drive system 16, thus forming the light reducing area. The reticle blind is moved in a direction (longitudinal direction) where the side of the light reducing area is extended. That is, there are considered two methods of forming the light reducing area, wherein a right aperture 15d of one blind is overlapped with a left aperture 15f of the other blind, and the right aperture 15d and the left aperture 15f of each blind are overlapped with each other. In addition, only one blind is moved right and left (in the directions where the two apertures are arranged), or alternatively, the two blinds are moved in directions opposite to each other. As illustrated in FIGS. 5A to 5D, FIGS. 6A to 6D and FIGS. 7A to 7D, there are totally 16 ways of making the above movements in combination. Note that the areas indicated by the oblique lines in FIGS. 5A to 5D, FIGS. 6A to 6D and FIGS. 7A to 7D are light reducing areas obtained by the light reducing portions 15c, 15e of the blind. Also, the areas shown by double oblique lines are light reducing areas obtained by moving the blind during an image projection.

Figure 5A:
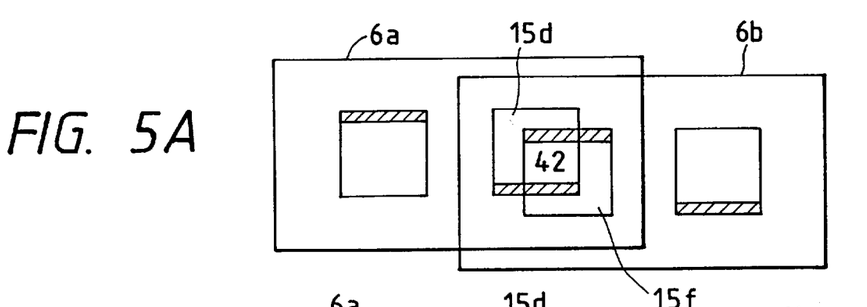
FIGS. 5A to 5D are views each showing an example of combination of the blinds according to the present invention.

Namely, referring to FIG. 5A, the aperture 15d of the blind 6a is overlapped with the aperture 15f of the blind 6b, and the two sides in the face-to-face relationship along the X-direction in the Figure serve as the light reducing areas. A shot area obtained thereby corresponds to a shot area 42 in FIG. 4C.

Figure 5B:
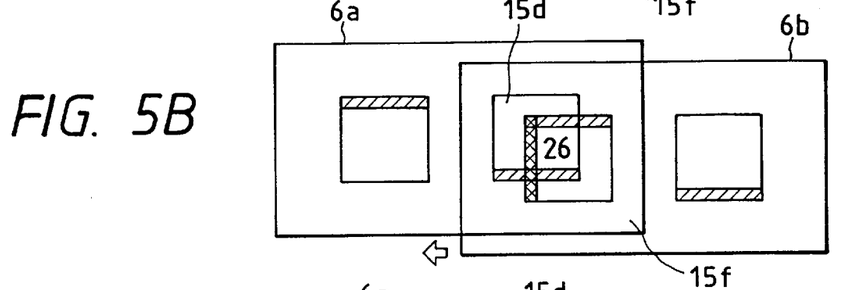

Referring to FIG. 5B, the aperture 15d of the blind 6a is overlapped with the aperture 15f of the blind 6b, and, at the same time, the blind 6b is moved in an arrowed direction during the reticle image projection, whereby the two sides bearing the face-to-face relationship along the X-direction in the Figure and one side along the Y-direction serve as light reducing areas. A shot area obtained thereby corresponds to a shot area 26 in FIG. 4A.

Figure 5C:
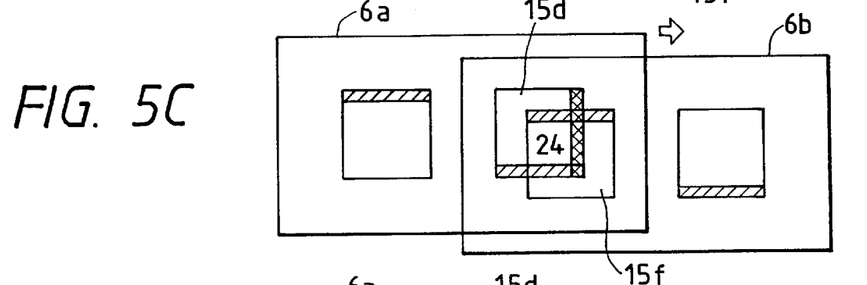

Turning attention to FIG. 5C, the aperture 15d of the blind 6a is overlapped with the aperture 15f of the blind 6b, and, at the same time, the blind 6a is moved in the arrowed direction during the reticle image projection, whereby the two sides bearing the face-to-face relationship along the X-direction in the Figure and one side along the Y-direction serve as light reducing areas. A shot area obtained thereby corresponds to a shot area 24 in FIG. 4A.

Figure 5D:
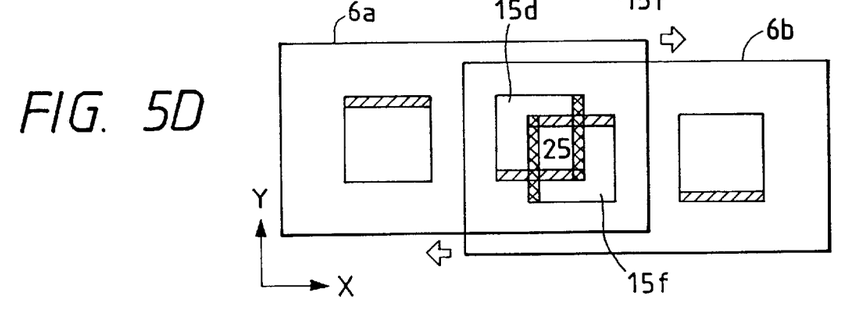

Referring to FIG. 5D, the aperture 15d of the blind 6a is overlapped with the aperture 15f of the blind 6b, and, at the same time, the blinds 6a, 6b are moved in the arrowed direction during the reticle image projection, whereby all the four sides serve as light reducing areas. A shot area obtained thereby corresponds to a shot area 25 in FIG. 4A.

Figure 6A:
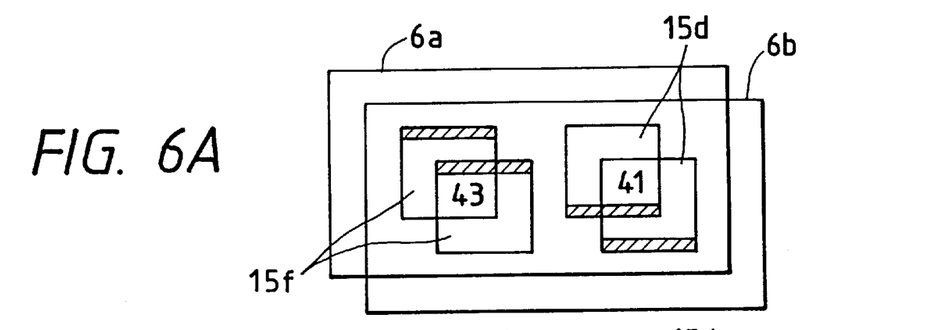
FIGS. 6A to 6D are views each showing an example of combination of the blinds according to the present invention.

Referring to FIG. 6A, the apertures 15d of the blinds 6a, 6b are overlapped with each other, or alternatively, the apertures 15f of the blinds 6a, 6b are overlapped with each other, whereby one sides along the X-direction serve as light reducing areas. A shot area obtained thereby corresponds to a shot area 41 or 43 in FIG. 4C.

Figure 6B:
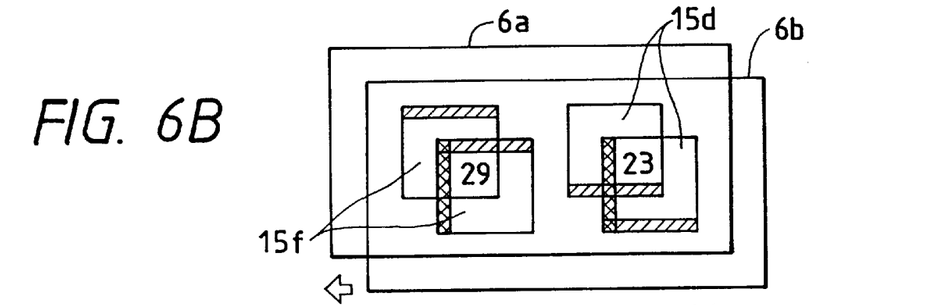

Referring to FIG. 6B, the apertures 15d of the blinds 6a, 6b are overlapped with each other, or alternatively, the apertures 15f of the blinds 6a, 6b are overlapped with each other, and, at the same time, the blind 6b is moved in the arrowed direction during the reticle image projection, whereby one sides along the X-direction in the Figure and one sides adjacent thereto serve as light reducing areas. A shot area obtained thereby corresponds to a shot area 23 or 29 in FIG. 4A.

Figure 6C:
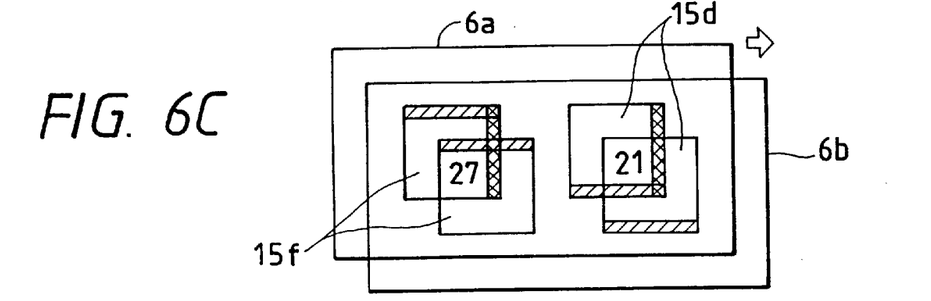

Referring to FIG. 6C, the apertures 15d of the blinds 6a, 6b are overlapped with each other, or alternatively, the apertures 15f of the blinds 6a, 6b are overlapped with each other, and, at the same time, the blind 6a is moved in the arrowed direction during the reticle image projection, whereby one sides along the X-direction in the Figure and one sides adjacent thereto serve as light reducing areas. A shot area obtained thereby corresponds to a shot area 21 or 27 in FIG. 4A.

Figure 6D:
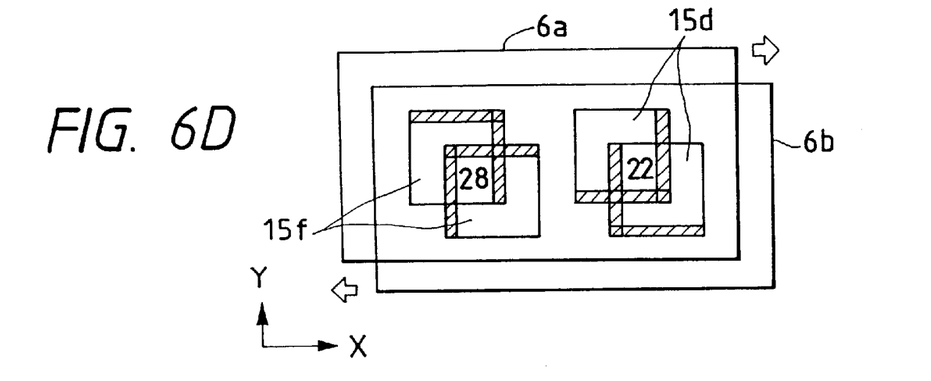

Referring to FIG. 6D, the apertures 15d of the blinds 6a, 6b are overlapped with each other, or alternatively, the apertures 15f of the blinds 6a, 6b are overlapped with each other, and, at the same time, the blinds 6a, 6b are moved in the arrowed direction during the reticle image projection, whereby one sides along the X-direction in the Figure and two sides in the face-to-face relationship along the Y-direction serve as light reducing areas. A shot area obtained thereby corresponds to a shot area 22 or 28 in FIG. 4A.

Figure 7A:
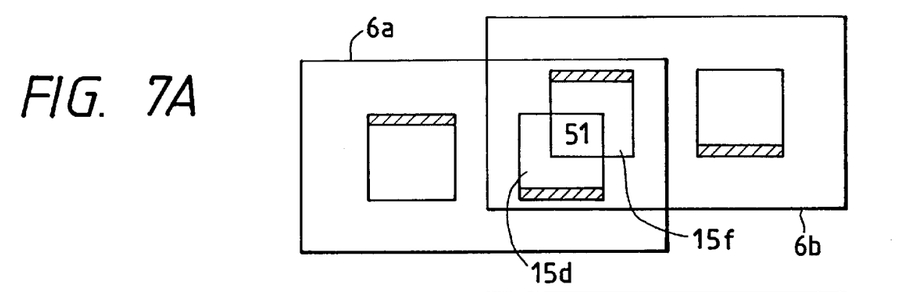
FIGS. 7A to 7D are views each showing an example of combination of the blinds according to the present invention.

Referring to FIG. 7A, the aperture 15d of the blind 6a is overlapped with the aperture 15f of the blind 6b, thereby forming a shot area including no light reducing area. A shot area obtained thereby corresponds to a shot area,51 in FIG. 4D.

Figure 7B:
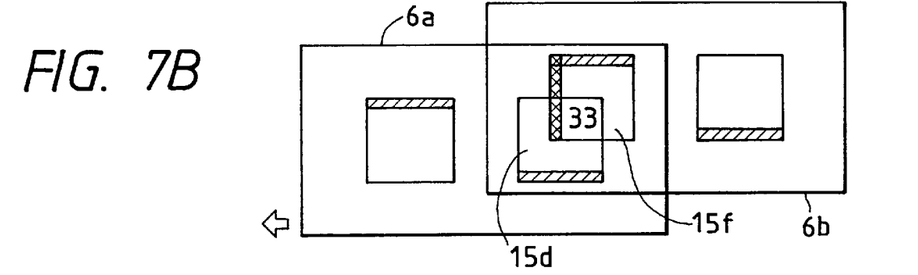

Referring to FIG. 7B, the aperture 15d of the blind 6a is overlapped with the aperture 15f of the blind 6b, and, at the same time, the blind 6a is moved in the arrowed direction during the reticle image projection, whereby only one side along the Y-direction in the Figure serves as a light reducing area. A shot area obtained thereby corresponds to a shot area 33 in FIG. 4B.

Figure 7C:
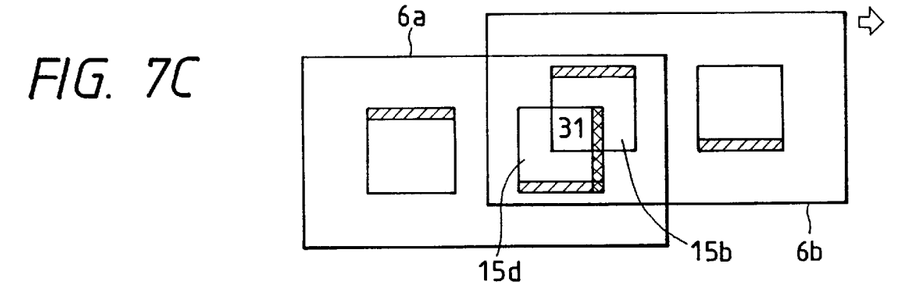

Referring to FIG. 7C, the aperture 15d of the blind 6a is overlapped with the aperture 15f of the blind 6b, and, at the same time, the blind 6b is moved in the arrowed direction during the reticle image projection, whereby only one side along the Y-direction serves as a light reducing area. A shot area obtained thereby corresponds to a shot area 31 in FIG. 4B.

Figure 7D:
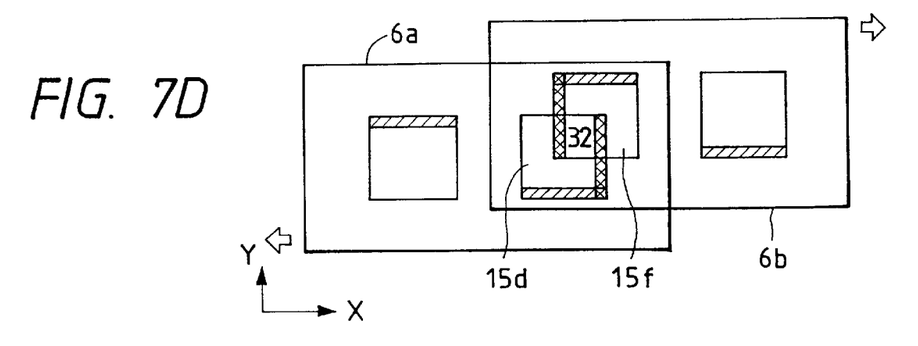
Figure 8A:
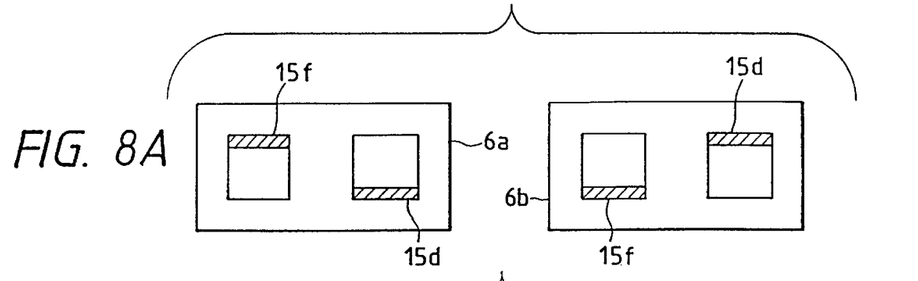
FIGS. 8A to 8D are views showing other examples of a light reducing portion of the blind.
Figure 8B:
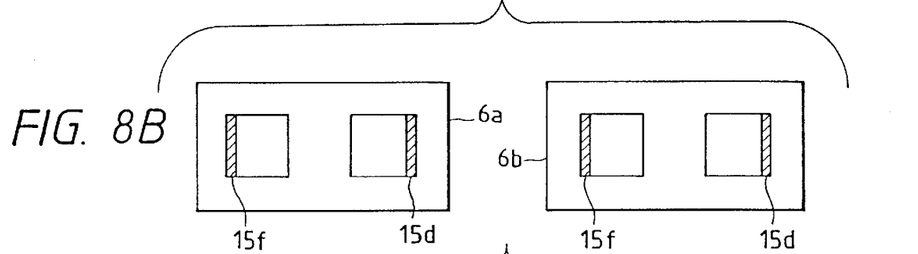
Figure 8C:
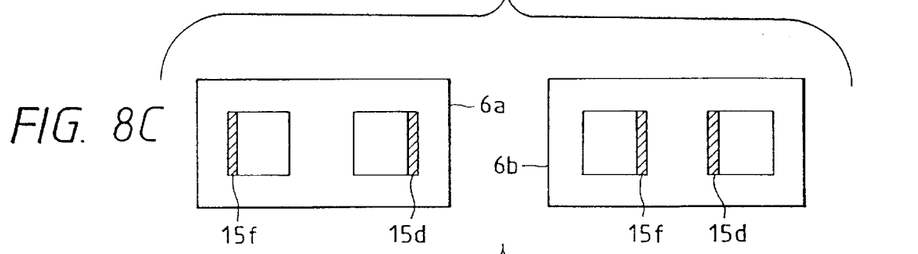
Figure 8D:
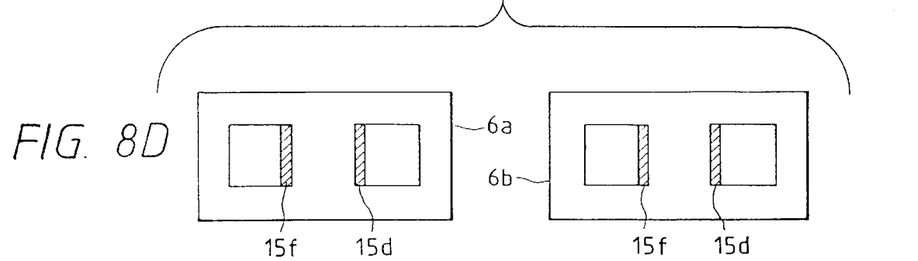

Referring to FIG. 7D, the aperture 15d of the blind 6a is overlapped with the aperture 15f of the blind 6b, and, at the same time, the blinds 6a, 6b are moved in the arrowed direction during the reticle image projection, whereby two sides along the Y-direction serve as light reducing areas. A shot area obtained thereby corresponds to a shot area 32 in FIG. 4B.

As illustrated in FIGS. 5A to 7D, the two blinds are combined, thereby making it possible to form all the shot areas needed in FIGS. 4A to 4D.

Combining the above-constructed two blinds eliminates not only the necessity for attaching and detaching the filter formed with the light reducing portions as in the prior art but also the necessities for providing the reticle with the light shielding band having a width equal to or larger than a width of the light reducing portion and for a special manufacturing process such as providing the reticle itself with the light reducing characteristic.

Moreover, the light reducing portion formed on the blind is employed in combination with the movement of the blind, and, therefore, an ideal light reducing characteristic can be obtained. For this reason, when, e.g., the two sides adjacent to each other are provided with the light reducing characteristic, and, even if there is produced a portion undergoing four exposing processes on the photosensitive substrate, the exposure quantity on this portion is substantially the same as the exposure quantity on other portions.

In accordance with the embodiments discussed above, the blind including the light reducing portion is exemplified in FIG. 2, but the combinational blinds as how in FIGS. 8A to 8D may also be employed.

It is apparent that, in this invention, a wide range of different working modes can be formed based on the invention without deviating from the spirit and scope of the invention. This invention is not restricted by its specific working modes except being limited by the appended claims.

What is claimed is:

1. An exposure method for exposing an image of a pattern of a reticle such that a synthesized pattern is formed on a substrate at a plurality of shot areas having respective overlapping portions, comprising:

disposing, at an incident side of said reticle, a field restricting device which includes a pair of aperture members each including a light shielding portion, a first rectangular aperture, and a light reducing portion; and relatively moving said pair of aperture members during exposure and adjusting an amount of exposure light at the respective overlapping portions of said shot areas.

2. An exposure method according to claim 1, wherein each aperture member of said pair of aperture members has said light reducing portion at a selected side of said first rectangular aperture.

3. An exposure method according to claim 2, wherein said light reducing portion is formed with dots each having a size under a resolution limit of said projection optical system.

4. An exposure method according to claim 2, wherein a density of said dots of said light reducing portion differs depending on a position on said light reducing portion.

5. An exposure method according to claim 1, wherein an amount of exposure light at the overlapping portions and an amount of exposure light at non-overlapping portions are substantially equal to each other.

6. An exposure method which exposes an image of a pattern of a reticle onto a substrate with exposure light, comprising the steps of:

disposing first and second aperture members at an incident side of said reticle in a face-to-face relationship with each other to form an illumination area of said exposure light on the reticle, the first aperture member having a light shielding portion and a first rectangular aperture, the second aperture member having a light shielding portion and a second aperture; and moving said first and second aperture members relative to each other during said exposure to adjust a light amount of said exposure.

7. An exposure method according to claim 6, wherein said second aperture is a rectangular aperture.

8. An exposure method according to claim 6, wherein said substrate is a glass plate.

9. A substrate on which a pattern has been transferred by the method according to claim 6.

10. An exposure method which transfers a pattern onto a substrate with an exposure beam in such a manner that the pattern is made to be overlapped in at least a portion of a predetermined shot area of a plurality of shot areas formed in the substrate, the method comprising the steps of:

selecting a shot area in said predetermined shot area, said selected shot area including a portion undergoing four exposing processes; and performing said exposing processes in such a manner that an exposure quantity on said portion undergoing four exposure processes in said selected shot area is substantially the same as an exposure quantity on other portions, by using a light reducing member having a predetermined transmissivity with respect to said exposure beam.

11. An exposure method according to claim 10, wherein said light reducing member comprises a transmissivity which becomes lower from the inside of said shot area toward the outside thereof.

12. An exposure method according to claim 10, wherein said other portions include a portion undergoing two exposing processes.

13. An exposure method according to claim 10, further comprising the step of moving said light reducing member.

14. An exposure method according to claim 10, wherein said predetermined shot area is rectangular.

15. An exposure method according to claim 11, wherein said transmissivity of the light reducing member varies linearly.

16. An exposure method according to claim 10, wherein said pattern is formed in a mask.

17. An exposure method according to claim 16, wherein said light reducing member is disposed off a position which is conjugate with said mask.

18. An exposure method according to claim 10, wherein said substrate is a glass plate.

19. A substrate on which a pattern has been transferred by the method according to claim 10.

* * * * *

UNITED STATES PATENT AND TRADEMARK OFFICE
CERTIFICATE OF CORRECTION

PATENT NO.      : 6,325,516 B1                                    Page 1 of 1
DATED           : December 4, 2001
INVENTOR(S)     : Tomoyuki Watanabe et al.

It is certified that error appears in the above-identified patent and that said Letters Patent is hereby corrected as shown below:

<u>Title page,</u>
After Item [75], insert the following:
-- [73] Assignee: Nikon Corporation, Tokyo (Japan) --

After the name of the Examiner, insert the following:
-- [74] *Attorney, Agent, or Firm*—Miles & Stockbridge P.C. --

Signed and Sealed this

Thirteenth Day of May, 2003

JAMES E. ROGAN
*Director of the United States Patent and Trademark Office*